(12) United States Patent
Okawa

(10) Patent No.: US 7,242,200 B2
(45) Date of Patent: Jul. 10, 2007

(54) SYSTEM FOR MEASURING FET CHARACTERISTICS

(75) Inventor: Yasushi Okawa, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/412,644

(22) Filed: Apr. 27, 2006

(65) Prior Publication Data

US 2006/0273807 A1 Dec. 7, 2006

(30) Foreign Application Priority Data

Apr. 28, 2005 (JP) .............................. 2005-131608

(51) Int. Cl.
*G01R 27/08* (2006.01)
*G01R 31/26* (2006.01)

(52) U.S. Cl. ...................................... 324/713; 324/769
(58) Field of Classification Search ................ 324/713, 324/769

See application file for complete search history.

(56) References Cited

U.S. PATENT DOCUMENTS 5,905,384 A * 5/1999 Inoue et al. ................ 324/769

FOREIGN PATENT DOCUMENTS

| JP | 04366778 | 12/1992 |
|---|---|---|
| JP | 09274064 | 10/1997 |
| JP | 2000227455 | 8/2000 |

OTHER PUBLICATIONS

K. A. Jenkins and J. Y-C. Sun, "Measurement of I-V Curves of Silicon-on-Insulator (SOI) MOSFET's Without Self-Heating", IEEE Electron Device Letters, vol. 16, No. 4, Apr. 1995, p. 145 to 147.
International Search Report dated Aug. 1, 2006 based on PCT application No. PCT/JP2006/308966.

* cited by examiner

*Primary Examiner*—Andrew H. Hirshfeld
*Assistant Examiner*—Timothy J. Dole

(57) ABSTRACT

An FET-characteristic measuring system applies a pulse output from a pulse generator to the gate of an FET in order to measure drain current flowing through the FET. The pulse has a voltage based on a set voltage. The measuring system includes a divider for dividing the pulse output from the pulse generator into a first pulse applied to the gate of the FET and a second pulse for voltage measurement; a voltage measuring device for measuring a voltage of the second pulse; and a set-voltage adjusting device for determining, based on the voltage of the second pulse, a target set voltage for the pulse generator to apply a pulse having a desired gate application voltage to the FET and for adjusting the set voltage to the target set voltage so that a voltage of the first pulse is equal to the desired gate application voltage.

5 Claims, 2 Drawing Sheets

ND RELATED ART STATEMENT

SYSTEM FOR MEASURING FET CHARACTERISTICS

BACKGROUND OF THE INVENTION AND RELATED ART STATEMENT

1. Field of the Invention

The present invention relates to a system for measuring characteristics of an FET (field effect transistor) in which a gate voltage in the form of a pulse having a set output voltage from a pulse generator is applied to the gate of an FET in order to measure drain current flowing through the FET. More specifically, the present invention relates to adjustment of the set voltage of the pulse generator so that a desired voltage is accurately applied to the gate of the FET.

2. Description of the Related Art

The IV (current-voltage) characteristics of an FET are determined by applying a predetermined DC (direct current) voltage to the gate of the FET while a predetermined bias voltage is applied to the drain.

However, for measuring the IV characteristic of an advanced MOSFET, such as a SOI (silicon on insulator) MOSFET, a strained-silicon MOSFET, or a MOSFET using a high-k (high dielectric constant) gate insulator, the known measuring method in which a DC voltage is applied to the gate of the FET cannot provide a reliable measurement result of the IV characteristic because of a self-heating phenomenon exhibited by the FET.

Accordingly, it has been proposed to apply a short-duration pulse to the gate of the FET (e.g., refer to K. A. Jenkins and J. Y-C. Sun, IEEE Electron Device Letters, Vol. 16, No. 4, April 1995, p 145 to 147). This allows the semiconductor device to operate without producing heat, thus making it possible to provide a measurement result that is not affected by heat production.

An output pulse from a pulse generator is input to the gate of an FET. However, since the value of a voltage output from the pulse generator is generally guaranteed only for a sufficiently long pulse width, the output voltage is in many cases not sufficiently stable for a pulse width of 100 ns or less. Thus, with a pulse having a pulse width of 100 ns or less, it is not desirable to directly use the output of the pulse generator from the viewpoint of providing high measurement accuracy.

OBJECT AND SUMMARY OF THE INVENTION

Accordingly, an object of the present invention is to provide an FET-characteristic measuring system that is capable of more accurately measuring the IV characteristics of advanced FETs, such as SOI MOSFETs, strained-silicon MOSFETs, or MOSFETs using high-k (high dielectric constant) gate insulators.

The present invention provides an FET-characteristic measuring system in which a pulse output from a pulse generator is applied to the gate of an FET in order to measure drain current flowing through the FET. The pulse has a voltage based on a set voltage (V_set). The FET-characteristic measuring system includes a divider for dividing the pulse output from the pulse generator into a first pulse applied to the gate of the FET and a second pulse for voltage measurement; voltage measuring means for measuring a voltage (V_meas) of the second pulse; and set-voltage adjusting means for determining, based on the voltage (V_meas) of the second pulse, a target set voltage for the pulse generator to apply a pulse having a desired gate application voltage (V_dut) to the FET and for adjusting the set voltage (V_set) to the target set voltage so that a voltage of the first pulse is equal to the desired gate application voltage (V_dut).

According to the present invention, the set-voltage adjusting means can include a terminating resistor connected to a transmission path for the first pulse and can execute: calculation for deriving, as a first voltage, a voltage (V_out) of the pulse output from the pulse generator, based on the voltage (V_meas) of the second pulse, divider impedances (Z_div) of the divider, an impedance (Z_term) of the terminating resistor, and an input impedance (Z_osc) of the voltage measuring means; calculation for deriving, as a second voltage, a voltage (V_out_i) of the pulse output from the pulse generator when a predetermined external impedance is connected to the pulse generator, based on the first voltage; calculation for deriving correction coefficients by linearly approximating the second voltage and the set voltage; and calculation for deriving the target set voltage (V_set) for the desired gate application voltage (V_dut), based on the correction coefficients, the divider impedances (Z_div) of the divider, the impedance (Z_term) of the terminating resistor, and the input impedance (Z_osc) of the voltage measuring means.

Considering the linearity of the output of the pulse generator, as the correction coefficients, correction coefficients for pulses in a low voltage range and correction coefficients for pulses in a high voltage range can be derived.

The voltage measurement can be accomplished using a digital oscilloscope.

In addition, the set-voltage adjusting means can execute calculation for deriving an actual gate application voltage (V_dut_act) of the FET based on the voltage (V_meas) of the second pulse and calculation for deriving a voltage difference (dV_dut) between the actual gate application voltage (V_dut_act) and the desired gate application voltage (V_dut), and can adjust the target set voltage so that the voltage difference (dV_dut) is less than or equal to a predetermined value.

According to the present invention, the voltage of the pulse output from the pulse generator is measured via the divider, and based on the result of the measurement, the voltage of the pulse output from the pulse generator is adjusted so that a gate voltage having a predetermined value is applied to the gate of the FET. Thus, even when the voltage output from the pulse generator does not match the set voltage, the measurement accuracy of the FET characteristic can be enhanced by applying a gate voltage having a desired value to the gate of the FET.

DETAILED DESCRIPTION OF PREFERRED EMBODIMENTS

Figure 1:
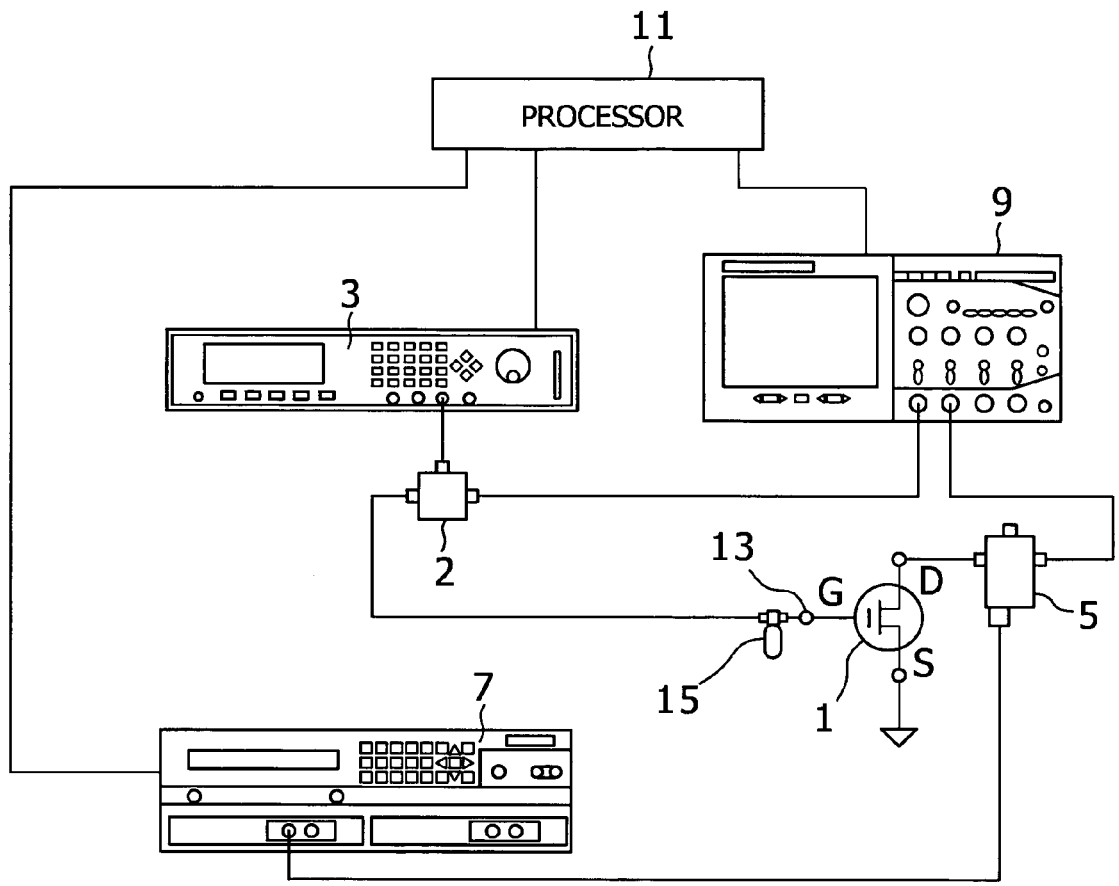
FIG. 1 is a block diagram showing an FET-characteristic measuring system according to an embodiment of the present invention.

FIG. 1 is a block diagram illustrating the configuration of an FET-characteristic measuring system according to the present invention. This FET-characteristic measuring system applies a short-duration pulse (e.g., 100 ns or less) to an FET 1 to measure the IV (current-voltage) characteristic thereof The FET 1 shown in FIG. 1 is a MOSFET manufactured by SOI (silicon on insulator) technology or strained-silicon fabrication technology.

The gate of the FET 1 is connected to the pulse generator 3 via a divider 2, and the drain of the FET 1 is connected to a current/voltage source 7 and a terminal (channel 2 in the example shown in FIG. 1) of an oscilloscope 9 (which may be a digital oscilloscope) via a so-called bias tee 5.

The DC voltage source 7 may be implemented with, for example, an SMU (source measure unit) capable of applying a high-accuracy DC voltage and measuring a current.

An example of the SMU is Agilent 4156 manufactured by Agilent Technologies, Inc.

Figure 2:
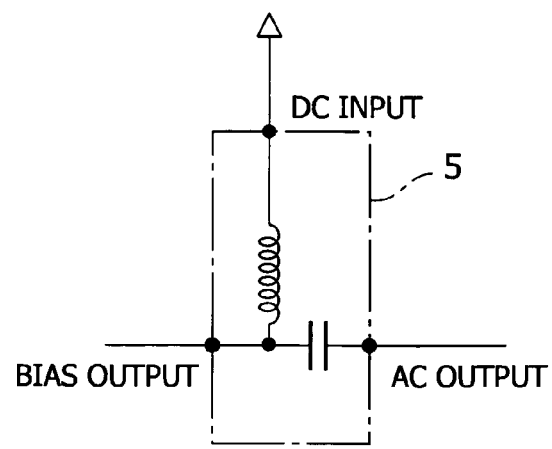
FIG. 2 is a circuit diagram showing the configuration of a bias tee.

FIG. 2 shows the configuration of the bias tee 5. This bias tee 5 has a bias output connected to the drain of the FET 1, a DC input connected to the current/voltage source 7, and an AC output connected to the oscilloscope 9.

In general, the value of the output voltage of the pulse generator 3 is guaranteed only for a sufficiently long pulse width, and the output voltage is in many cases not sufficiently stable for a pulse width of 100 ns or less. Thus, in the measuring system according to the present embodiment, which uses a pulse having a pulse width of 100 ns or less, to directly use the output of the pulse generator 3 based on a set value is not desirable from the viewpoint of enhancing the measurement accuracy.

Accordingly, in the FET-characteristic measuring system according to the present embodiment, the voltage of the output pulse of the pulse generator 3 is measured via the divider 2, and based on the result of the measurement, the voltage of the output pulse of the pulse generator 3 is adjusted so that a gate voltage having a desired value is applied to the gate of the FET 1.

Means for adjusting the voltage set in the pulse generator 3 and a procedure for this adjustment will be described below.

Figure 3:
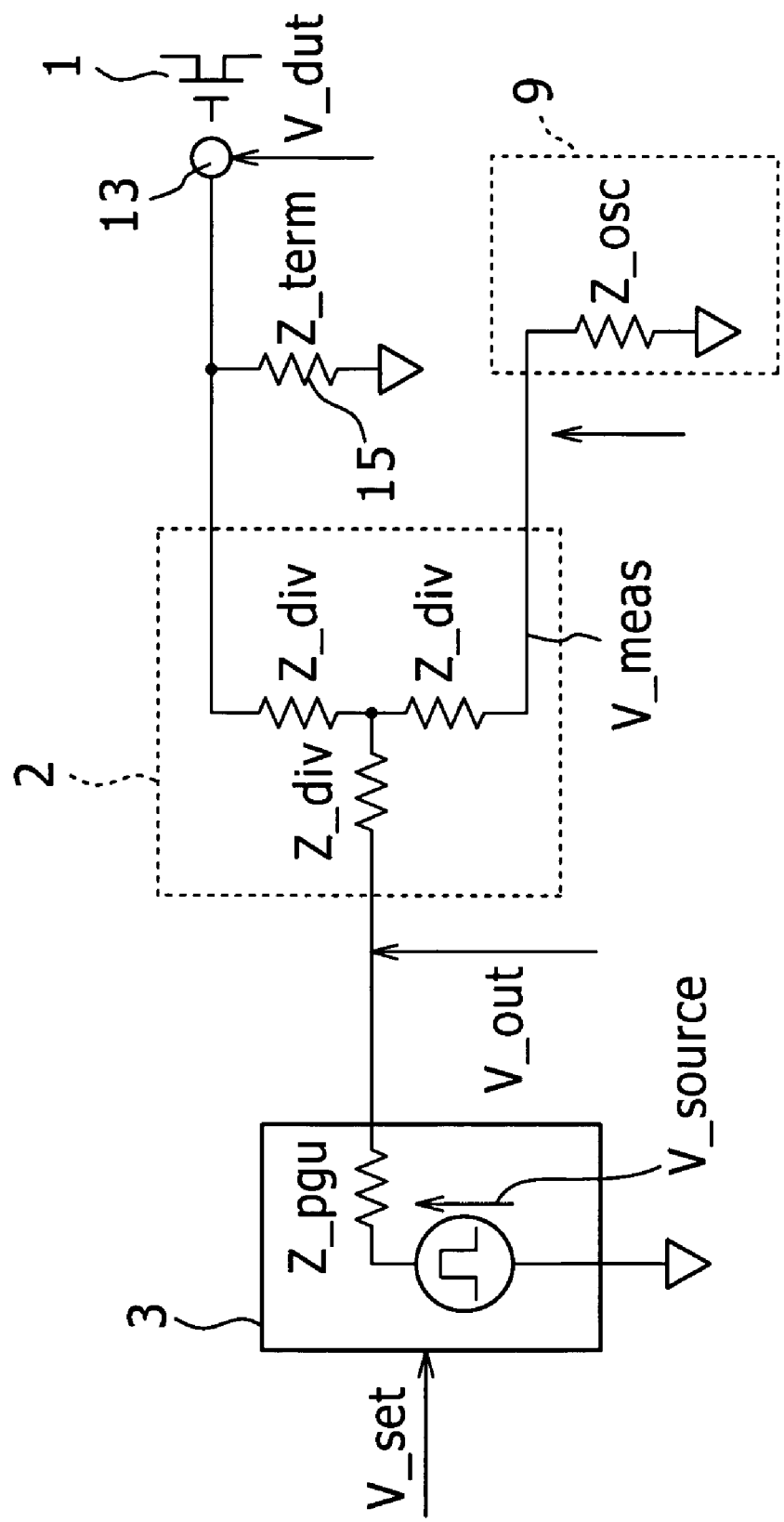
FIG. 3 is a circuit diagram showing inter-connections of a pulse generator, a divider, and an oscilloscope.

As shown in FIG. 3, an output of the pulse generator 3 is connected to an input of the divider 2. A first output of the divider 2 is connected to a terminal 13, which is connected to the gate of the FET 1, and a second output of the divider 2 is connected to a pulse-voltage monitor input (channel 1 in the example shown in FIG. 1) of the oscilloscope 9. A terminating resistor 15 is connected to the line between the first output of the divider 2 and the terminal 13.

In FIG. 3, Z_pgu indicates the output impedance of the pulse generator 3, Z_div indicates the impedance of each divider element (resistor) of the divider 2, Z_term indicates the impedance of the terminating resistor 15 and Z_osc indicates the input impedance of the oscilloscope 9.

When the input impedance Z_osc of the oscilloscope 9 is to be measured, it can be measured as follows.

That is, a measurement terminal of a network analyzer or impedance measurement unit (not shown) is connected to an input terminal (channel 1 in FIG. 1) of the oscilloscope 9, and input impedances of the oscilloscope 9 are measured for multiple frequencies that cover the frequency of a pulse applied to the gate of the FET 1. Based on the measurement results of the input impedances with respect to the multiple frequencies, an input impedance at a desired frequency is determined by interpolation.

With the known impedance measuring method in which the input impedance Z_osc is measured using an SMU, only the input impedance at DC (direct current) can be measured. Thus, the use of the known method to measure the input impedance Z_osc in an IV characteristic measuring system using a short pulse containing high frequency components may fail to provide a highly reliable measurement result.

A processor 11 executes the procedure below to adjust the output voltage of the pulse generator 3 so that a pulse having a desired gate voltage is supplied to the terminal 13 (see FIG. 3) to which the gate of the FET 1 is connected.

(Step 1)

An entire impedance Z_ext obtained by viewing the divider 2 side from the output terminal of the pulse generator 3 is given by Equation (1).

$$Z\_ext = Z\_div + \frac{(Z\_div + Z\_term)(Z\_div + Z\_osc)}{(Z\_div + Z\_term) + (Z\_div + Z\_osc)} \quad (1)$$

Thus, on taking into account of matching impedance in the FET-characteristic measuring system according to the present embodiment, Z_div, Z_term, and Z_osc are selected 50/3 Ω, 50 Ω, and 50 Ω, respectively, and Z_ext becomes 50 Ω.

The relationship between an output voltage V_out of the pulse generator 3 and a measurement voltage V_meas of the oscilloscope 9 is expressed by Equation (2) and (3) below.

$$V\_meas = V\_out \times \frac{1}{Z\_ext} \times \frac{(Z\_div + Z\_term)(Z\_div + Z\_osc)}{(Z\_div + Z\_term) + (Z\_div + Z\_osc)} \times \frac{Z\_osc}{Z\_osc + Z\_div} \quad (2)$$

$$V\_out = V\_meas \times \frac{Z\_ext}{Z\_osc} \times \frac{(Z\_div + Z\_term)(Z\_div + Z\_osc)}{(Z\_div + Z\_term)} \quad (3)$$

Typically, the pulse generator 3 is calibrated with respect to an ideal external impedance 50 Ω, and the output obtained after the calibration has gain error and offset error.

An output voltage V_out_i of the pulse generator 3 when the external impedance is 50 Ω is expressed by Equation (4):

$$V\_out\_i = \frac{50}{Z\_pgu + 50} V\_source \quad (4)$$

where V_source indicates an output voltage when the output of the pulse generator 3 is turned on and V_set indicates a specific value for setting the output of the pulse generator 3 under a load of 50 Ω.

The output voltage V_out of the pulse generator 3 is output in accordance with a set value (specific value) V_set sent from the processor 11. The output voltage V_out_i when a 50 Ω load is connected to the output of the pulse generator 3 is obtained when the setting value V_set satisfies V_set=V_out_i. Thus, in Equation (4), when V_out_i=V_set and Z_pgu=50 106, the relationship between V_source and V_set is expressed by:

$$V\_source = 2 \times V\_set$$

On the other hand, the output voltage V_out of the pulse generator 3 when an actual measuring system is connected, as shown in FIG. 3, is expressed by Equation (5) using the impedance Z_ext.

$$V\_out = \frac{Z\_ext}{Z\_pgu + Z\_ext} V\_source \quad (5)$$

Equations (4) and (5) yield Equation (6) below:

$$\text{V\_out\_i} = \frac{50}{Z\_pgu + 50} \times \frac{Z\_pgu + Z\_ext}{Z\_ext} \text{V\_out} \quad (6)$$

When Z_pgu=50, Equation (6) above is expressed as Equation (7) below. V_out in Equation (7) is calculated based on Equation (3) and the measurement value V_meas of the oscilloscope 9.

$$\text{V\_out\_i} = \frac{50 + Z\_ext}{2Z\_ext} \text{V\_out} \quad (7)$$

Therefore, the output voltage V_out_i of the pulse generator 3 when the external impedance is 50 Ω is calculated based on Equations (3) and (7) and the measurement value V_meas of the oscilloscope. Then, the calculated output voltage V_out_i and the voltage V_set set for the pulse generator 3 are linearly approximated by a least squares method to derive a correction coefficient A for the gain error and a correction coefficient B for the offset error, as expressed in Equation (8):

$$V\_out\_i = A \times V\_set + B \quad (8)$$

The pulse generator 3 outputs a positive pulse and a negative pulse in accordance with the polarity of the FET 1. Thus, the correction coefficients A and B are each derived with respect to both positive and negative pulses.

(Step 2)

A gate voltage V_dut applied to the FET 1 can be inversely calculated by Equation (9):

$$\text{V\_dut} = \text{V\_out} \times \frac{1}{Z\_ext} \times$$
$$\frac{(Z\_div + Z\_term)(Z\_div + Z\_osc)}{(Z\_div + Z\_term) + (Z\_div + Z\_osc)} \times \frac{Z\_term}{Z\_term + Z\_div} \quad (9)$$

Using Equation (7), Equation (9) can be expressed as Equation (10) below:

$$\text{V\_dut} = \text{V\_out\_i} \frac{2Z\_ext}{50 + Z\_ext} \times \frac{1}{Z\_ext} \times$$
$$\frac{(Z\_div + Z\_term)(Z\_div + Z\_osc)}{(Z\_div + Z\_term) + (Z\_div + Z\_osc)} \times \frac{Z\_term}{Z\_term + Z\_div} \quad (10)$$

Therefore, Equations (8) and (10) yield the relationships in Equations (11) and (12), as follows:

$$A \times \text{V\_set} + B = \text{V\_dut} \frac{50 + Z\_ext}{2Z\_term} \times \frac{(Z\_div + Z\_term) + (Z\_div + Z\_osc)}{(Z\_div + Z\_osc)} \quad (11)$$

$$\text{V\_set} = \left[ \text{V\_dut} \frac{50 + Z\_ext}{2Z\_term} \times \frac{(Z\_div + Z\_term) + (Z\_div + Z\_osc)}{(Z\_div + Z\_osc)} - B \right] / A \quad (12)$$

Equation (12) indicates the relationship between the voltage V_dut applied to the gate of the FET 1 and the corresponding set voltage V_set of the pulse generator 3.

When every impedance in Equation (12) has an ideal value (50 Ω) and the output of the pulse generator 3 is free of error (A=1 and B=0), Equation (12) becomes:

$$V\_set = 2 \times V\_dut \quad (13)$$

(Step 3)

Based on Equation (12), the target set voltage V_set for generating the desired gate voltage V_dut is calculated and is input to the pulse generator 3 during the measurement of the IV characteristic.

Inputting the target set voltage V_set allows the desired gate voltage V_dut to be accurately applied to the gate of the FET 1. Executing processing as described below for removing the influence of other error factors (e.g., nonlinear error components and variation due to temperature changes) allows a more accurate gate voltage V_dut to be applied to the gate of the FET 1.

That is, an actual gate application voltage V_dut_act of the FET 1 is calculated from the actual measurement V_meas of the oscilloscope 9, based on Equation (14):

$$\text{V\_dut\_act} = \frac{\text{V\_meas} \times (Z\_div + Z\_term)}{Z\_term} \times \frac{Z\_osc}{Z\_osc + Z\_div} \quad (14)$$

A voltage difference dV_dut between the determined actual gate application voltage V_dut_act and the voltage V_dut determined using Equation (9) is calculated (see Equation (15)) and the target set voltage V_set is adjusted so that the voltage difference dV_dut is less than or equal to a predetermined value (e.g., within ±1% or ±1 mV of V_dut).

$$dV\_dut = V\_dut\_act - V\_dut \quad (15)$$

For measuring the IV characteristic of the FET 1, the processor 11 controls the output voltage of the current/voltage source 7 to apply multiple drain voltages to the FET 1 via the bias tee 5 and causes the pulse generator 3 to output a pulse having the voltage adjusted as described above. As a result, a pulse having the desired gate voltage V_dut is applied to the gate of the FET 1, so that drain currents corresponding to the multiple drain voltages flow in the FET 1.

At this time, a current corresponding to the drain current of the FET 1 flows through a DC-blocking capacitor (see FIG. 2) built into the bias tee 5. The current flowing through the DC-blocking capacitor is converted by an impedance, obtained by viewing the bias tee 5 and the oscilloscope 9 from the drain of the FET 1, into a voltage pulse corresponding to the drain current and the voltage of the voltage pulse is measured by the oscilloscope 9.

Considering the AC behavior, electrical continuity is effectively established between the bias output and the AC output of the bias tee 5, whereas almost no current flows between the bias output and the DC input because of the high impedance. Thus, the drain current becomes equal to the current flowing through the internal impedance of the oscilloscope 9. The measurement result of the drain current is obtained by the processor 11.

That is, drain currents with respect to the multiple drain voltages based on a desired gate voltage V_dut are measured and drain currents with respect to the multiple drain voltages based on other desired gate voltages V_dut are similarly measured, thus obtaining the IV characteristic of the FET 1.

As described above, in the FET-characteristic measuring system according to the present embodiment, the voltage of the output pulse of the pulse generator 3 is measured via the divider 2, and based on the result of the measurement, the voltage of the output pulse of the pulse generator 3 is adjusted so that a gate voltage having a desired value is applied to the gate of the FET 1. Thus, even when the output voltage of the pulse generator 3 does not match the set voltage V_set, the measurement accuracy of the IV characteristic of the FET 1 can be significantly enhanced by applying a gate voltage having a desired value to the gate of the FET 1.

While an embodiment of the present invention has been described above, various changes and modifications can be made thereto.

For example, although the output impedance Z_pgu of the pulse generator 3 has a known value (50 Ω) in Equation (12), the output impedance Z_pgu can be measured in advance when it is unknown.

For the impedance Z_div of each divider element of the divider 2, the impedance Z_term of the terminating resistor 15, and the input impedance Z_osc of the oscilloscope 9, 50/3 Ω, 50 Ω, and 50 Ω are used, respectively, for example.

When there is a problem with the linearity of the output of the pulse generator 3, the correction coefficients A and B shown in Equation (8) may be derived separately as correction coefficients for positive and negative pulses in a low voltage range and correction coefficients for positive and negative pulses in a high voltage range, as needed.

The invention claimed is:

1. A field-effect-transistor characteristic measuring system in which a pulse output from a pulse generator is applied to a gate of a field effect transistor to measure drain current flowing through the field effect transistor, the pulse having a voltage based on a set voltage, the measuring system comprising: a divider for dividing the pulse output from the pulse generator into a first pulse applied to the gate of the field effect transistor and a second pulse for voltage measurement; voltage measuring means for measuring a voltage of the second pulse; and set-voltage adjusting means comprising a terminating resistor connected to a transmission path for the first pulse, wherein said set-voltage adjusting means is for determining, based on the voltage of the second pulse, a target set voltage for the pulse generator to apply a pulse having a desired gate application voltage to the field effect transistor and for adjusting the set voltage to the target set voltage so that a voltage of the first pulse is equal to the desired gate application voltage.

2. A field-effect-transistor characteristic measuring system according to claim 1, wherein the set-voltage adjusting means executes: calculation for deriving, as a first voltage, a voltage of the pulse output from the pulse generator, based on the voltage of the second pulse, divider impedances of the divider, an impedance of the terminating resistor, and an input impedance of the voltage measuring means; calculation for deriving, as a second voltage, a voltage of the pulse output from the pulse generator when a predetermined external impedance is connected to the pulse generator, based on the first voltage; calculation for deriving correction coefficients by linearly approximating the second voltage and the set voltage; and calculation for deriving the target set voltage for the desired gate application voltage, based on the correction coefficients, the divider impedances of the divider, the impedance of the terminating resistor, and the input impedance of the voltage measuring means.

3. The field-effect-transistor characteristic measuring system according to claim 2, wherein, as the correction coefficients, correction coefficients for pulses in a low voltage range and correction coefficients for pulses in a high voltage range are derived.

4. The field-effect-transistor characteristic measuring system according to claim 1, wherein the voltage measuring means comprises a digital oscilloscope.

5. The field-effect-transistor characteristic measuring system according to claim 1, wherein the set-voltage adjusting means executes calculation for deriving an actual gate application voltage of the field effect transistor based on the voltage of the second pulse and calculation for deriving a voltage difference between the actual gate application voltage and the desired gate application voltage, and adjusts the target set voltage so that the voltage difference is less than or equal to a predetermined value.

* * * * *